United States Patent
Lv et al.

(10) Patent No.: US 12,205,555 B2
(45) Date of Patent: Jan. 21, 2025

(54) GATE DRIVING CIRCUIT AND DISPLAY PANEL

(71) Applicant: WUHAN CHINA STAR OPTOELECTRONICS TECHNOLOGY CO., LTD., Hubei (CN)

(72) Inventors: Jing Lv, Hubei (CN); Guoyu Zhang, Hubei (CN); Yuhang Jiang, Hubei (CN)

(73) Assignee: WUHAN CHINA STAR OPTOELECTRONICS TECHNOLOGY CO., LTD., Hubei (CN)

( * ) Notice: Subject to any disclaimer, the term of this patent is extended or adjusted under 35 U.S.C. 154(b) by 0 days.

(21) Appl. No.: 17/622,758

(22) PCT Filed: Dec. 15, 2021

(86) PCT No.: PCT/CN2021/138491
§ 371 (c)(1),
(2) Date: Dec. 24, 2021

(87) PCT Pub. No.: WO2023/102984
PCT Pub. Date: Jun. 15, 2023

(65) Prior Publication Data
US 2024/0038193 A1 Feb. 1, 2024

(30) Foreign Application Priority Data
Dec. 9, 2021 (CN) .......................... 202111496726.5

(51) Int. Cl.
*G09G 3/36* (2006.01)

(52) U.S. Cl.
CPC ....... *G09G 3/3677* (2013.01); *G09G 2310/08* (2013.01)

(58) Field of Classification Search
CPC ..... G09G 3/36; G09G 3/3677; G09G 2310/08
See application file for complete search history.

(56) References Cited

U.S. PATENT DOCUMENTS

2010/0272228 A1  10/2010  Hsiao
2013/0249884 A1   9/2013  Kim
(Continued)

FOREIGN PATENT DOCUMENTS

CN    106409261 A    2/2017
CN    106782389 A    5/2017
(Continued)

OTHER PUBLICATIONS

Chinese Office Action in corresponding Chinese Patent Application No. 202111496726.5 dated Jul. 20, 2022, pp. 1-8.
(Continued)

*Primary Examiner* — Amare Mengistu
*Assistant Examiner* — Jennifer L Zubajlo
(74) *Attorney, Agent, or Firm* — PV IP PC; Wei Te Chung

(57) ABSTRACT

A gate driving circuit and a display panel. The gate driving circuit includes a plurality of cascaded gate driving units, wherein a Nth stage gate driving unit includes a pull-up control module and a node signal control module. By an adjustment of the signals connected to a first input terminal, a second input terminal, a first control terminal, and a second control terminal of the node signal control module, an original driving time sequence can be realized without using a clock signal, which reduces a space occupied by a frame.

18 Claims, 3 Drawing Sheets

(56) References Cited

U.S. PATENT DOCUMENTS

| | | | |
|---|---|---|---|
| 2016/0293094 A1 | 10/2016 | Park | |
| 2018/0068628 A1* | 3/2018 | Xiao | G09G 3/3648 |
| 2019/0130858 A1* | 5/2019 | Xiao | G09G 3/3677 |
| 2020/0082746 A1* | 3/2020 | Zhang | G09G 3/3677 |
| 2020/0160805 A1* | 5/2020 | Hong | G09G 3/20 |
| 2021/0118390 A1* | 4/2021 | Du | G09G 3/3677 |
| 2022/0130306 A1* | 4/2022 | Zhou | G09G 3/3266 |
| 2022/0358891 A1* | 11/2022 | Lv | G11C 19/28 |
| 2023/0103641 A1* | 4/2023 | Tao | G09G 3/3677 |
| | | | 345/206 |
| 2023/0177991 A1* | 6/2023 | Tao | G09G 3/20 |
| | | | 345/206 |
| 2024/0038193 A1* | 2/2024 | Lv | G09G 3/3677 |

FOREIGN PATENT DOCUMENTS

| | | | | |
|---|---|---|---|---|
| CN | 109064961 A | | 12/2018 | |
| CN | 109616060 A | | 4/2019 | |
| CN | 111179871 A | | 5/2020 | |
| CN | 111312177 A | * | 6/2020 | G09G 3/20 |
| CN | 111477153 A | * | 7/2020 | G09G 3/20 |
| CN | 112086076 A | | 12/2020 | |
| JP | 2000187461 A | | 7/2000 | |

OTHER PUBLICATIONS

International Search Report in International application No. PCT/CN2021/138491, mailed on Aug. 25, 2022.
Written Opinion of the International Searching Authority in International application No. PCT/CN2021/138491, mailed on Aug. 25, 2022.

* cited by examiner

GATE DRIVING CIRCUIT AND DISPLAY PANEL

FIELD OF INVENTION

The present application relates to display technologies, and more particularly, to a gate driving circuit and a display panel.

BACKGROUND OF INVENTION

The gate driving circuit can also be called gate driver on array (GOA) circuit, which uses an array process of thin film transistor liquid crystal displays to manufacture a row scan driving signal circuit on an array substrate to realize a progressive scan to the gate electrodes.

Compared with a traditional fan-out design, a use of GOA will reduce a frame of the display panel. Further, if a function of the GOA circuit can be kept unchanged, it can also reduce a number of GOA circuit components and/or a number of signal lines, the required frame will be smaller and more extreme.

For example, in a GOA circuit shown in FIG. 1, a node signal control module 1 used in it requires a clock signal CK (N+1) and a clock signal CK (N−1). Correspondingly, two clock lines are required to transmit the two clock signals separately, more frames are needed to carry the GOA circuit. In addition, the node signal control module 1 needs three thin film transistors to be realized. As we all know, the more the thin film transistors used, the bigger frame to carry the corresponding device. Therefore, providing a gate driving circuit with less devices and/or signal lines is beneficial to realize a narrow frame.

It should be noted that the above-mentioned introduction of the background technology is only for a purpose of facilitating a clear and complete understanding of the technical solutions of the present application. Therefore, it cannot be considered that the above-mentioned technical solutions involved are known to those skilled in the art just because it appears in the background art of the present application.

SUMMARY OF INVENTION

The embodiment of the present application provides a gate driving circuit and a display device to alleviate a technical problem that a large number of clock signal lines is not conducive to achieve a narrow frame.

In a first aspect, the present application provides a gate driving circuit, wherein the gate driving circuit includes a plurality of cascaded gate driving units, and wherein a Nth stage gate driving unit configured to output a Nth stage gate driving signal includes:
  a pull-up control module, wherein an output terminal of the pull-up control module is electrically connected to a first pull-up node; and
  a node signal control module, wherein a first input terminal of the node signal control module is configured to receive a forward scan control signal, and wherein a second input terminal of the node signal control module is configured to receive a reverse scan control signal, and wherein a first control terminal of the node signal control module is configured to receive a first gate electrode driving signal, and wherein a second control terminal of the node signal control module is configured to receive the second gate electrode driving signal, and wherein an output terminal of the node signal control module is electrically connected to a pull-down node.

In some of the embodiments, the node signal control module includes:
  a first transistor, wherein one of a source electrode and a drain electrode of the first transistor is configured to receive the forward scan control signal, and wherein a gate electrode of the first transistor is configured to receive the first gate electrode driving signal; and
  a second transistor, wherein one of a source electrode and a drain electrode of the second transistor is configured to receive the reverse scan control signal, and wherein a gate electrode of the second transistor is configured to receive the second gate electrode driving signal, another one of the source electrode and the drain electrode of the second transistor is electrically connected to another one of the source electrode and the drain electrode of the first transistor, and the pull-down node.

In some of the embodiments, a channel type of the first transistor is the same as a channel type of the second transistor.

In some of the embodiments, an input terminal of the pull-up control module is electrically connected to a first input terminal of the node signal control module and wherein a control terminal of the pull-up control module is electrically connected to a second control terminal of the pull-up control module.

In some of the embodiments, the Nth stage gate driving unit further includes:
  a reverse scanning auxiliary module, wherein an input terminal of the reverse scanning auxiliary module is electrically connected to a second input terminal of the node signal control module, and wherein a control terminal of the reverse scanning auxiliary module is electrically connected to a first control terminal of the node signal control module, and wherein the output terminal of the reverse scan auxiliary module is electrically connected to the first pull-up node.

In some of the embodiments, the Nth stage gate driving unit further includes:
  a first pull-down module, wherein an input terminal of the first pull-down module receives a low electrical potential signal, and wherein a control terminal of the first pull-down module is electrically connected to an output terminal of the reverse scan auxiliary module, and wherein an output terminal of the first pull-down module is electrically connected to the pull-down node.

In some of the embodiments, the Nth stage gate driving unit further includes:
  a third transistor, wherein one of a source electrode and a drain electrode of the third transistor is electrically connected to the first pull-up node, wherein a gate electrode of the third transistor is configured to receive a first global control signal, and wherein another one of the source electrode and the drain electrode of the third transistor is electrically connected to a second pull-up node.

In some of the embodiments, the Nth stage gate driving unit further includes:
  a first capacitor, wherein one terminal of the first capacitor is electrically connected to the first pull-up node, and another terminal of the first capacitor receives a low electrical potential signal; and
  a fourth transistor, wherein a gate electrode of the fourth transistor is electrically connected to the second pull-up node, and wherein one of a source electrode and a drain electrode of the fourth transistor is configured to receive a first clock signal, and wherein another one of the source electrode and the drain electrode of the fourth transistor is configured to output the Nth stage gate driving signal.

In some of the embodiments, the Nth stage gate driving unit further includes:

a fifth transistor, wherein one of a source electrode and a drain electrode of the fifth transistor is electrically connected to the another terminal of the first capacitor, and wherein a gate electrode of the fifth transistor is electrically connected to the pull-down node, and wherein another one of the source electrode and the drain electrode of the fifth transistor is electrically connected to the first pull-up node;

a sixth transistor, wherein one of a source electrode and a drain electrode of the sixth transistor is electrically connected to the one of the source electrode and the drain electrode of the fifth transistor, and wherein another one of the source electrode and the drain electrode of the sixth transistor is electrically connected to another one of the source electrode and the drain electrode of the fourth transistor, and wherein a gate electrode of the sixth transistor is electrically connected to the pull-down node;

a seventh transistor, wherein a gate electrode of the seventh transistor is electrically connected to one of a source electrode and a drain electrode of the seventh transistor and receives a second global control signal, wherein another one of a source electrode and a drain electrode of the seventh transistor is electrically connected to the another one of the source electrode and the drain electrode of the sixth transistor;

an eighth transistor, wherein a gate electrode of the eighth transistor is electrically connected to the gate electrode of the seventh transistor, and one of a source electrode and a drain electrode of the eighth transistor is electrically connected to the one of the source electrode and the drain electrode of the sixth transistor, and wherein another one of the source electrode and the drain electrode is electrically connected to the pull-down node;

a ninth transistor, wherein a gate electrode of the ninth transistor and one of a source electrode and a drain electrode of the ninth transistor receive a reset signal, and wherein another one of the source electrode and the drain electrode of the ninth transistor is electrically connected to the pull-down node;

a tenth transistor, wherein a gate electrode of the tenth transistor receives a third global control signal, wherein one of a source electrode and a drain electrode of the tenth transistor is electrically connected to the another one of the source electrode and the drain electrode of the eighth transistor, and wherein another one of the source electrode and the drain electrode of the tenth transistor is electrically connected to the another one of the source electrode and the drain electrode of the sixth transistor; and a second capacitor, wherein one terminal of the second capacitor is electrically connected to the pull-down node, and another terminal of the second capacitor is electrically connected to the one of the source electrode and the drain electrode of the eighth transistor.

In a second aspect, the present application provides a display panel including the gate driving circuit in at least one of the above embodiments, and the gate driving circuit is positioned in a non-display region of the display panel.

The gate driving circuit and the display panel provided by the present application, by adjusting the signals received by the first input terminal, the second input terminal, the first control terminal, and the second control terminal of the node signal control module to realize an original driving sequence without using clock signals, which reduces a number of clock signal lines, and reduces a space occupied by the frame. At the same time, because the currently driving time sequence can also be realized without using the clock signals, an overall load and an overall power consumption of the clock signals can be reduced.

DETAILED DESCRIPTION OF EMBODIMENTS

In order to make the purpose, technical solutions, and effects of the present application clearer and more specific, the following further describes the present application in detail with reference to the accompanying figures and examples. It should be understood that the specific embodiments described here are only used to explain the present application, and are not used to limit the present application.

Figure 2:
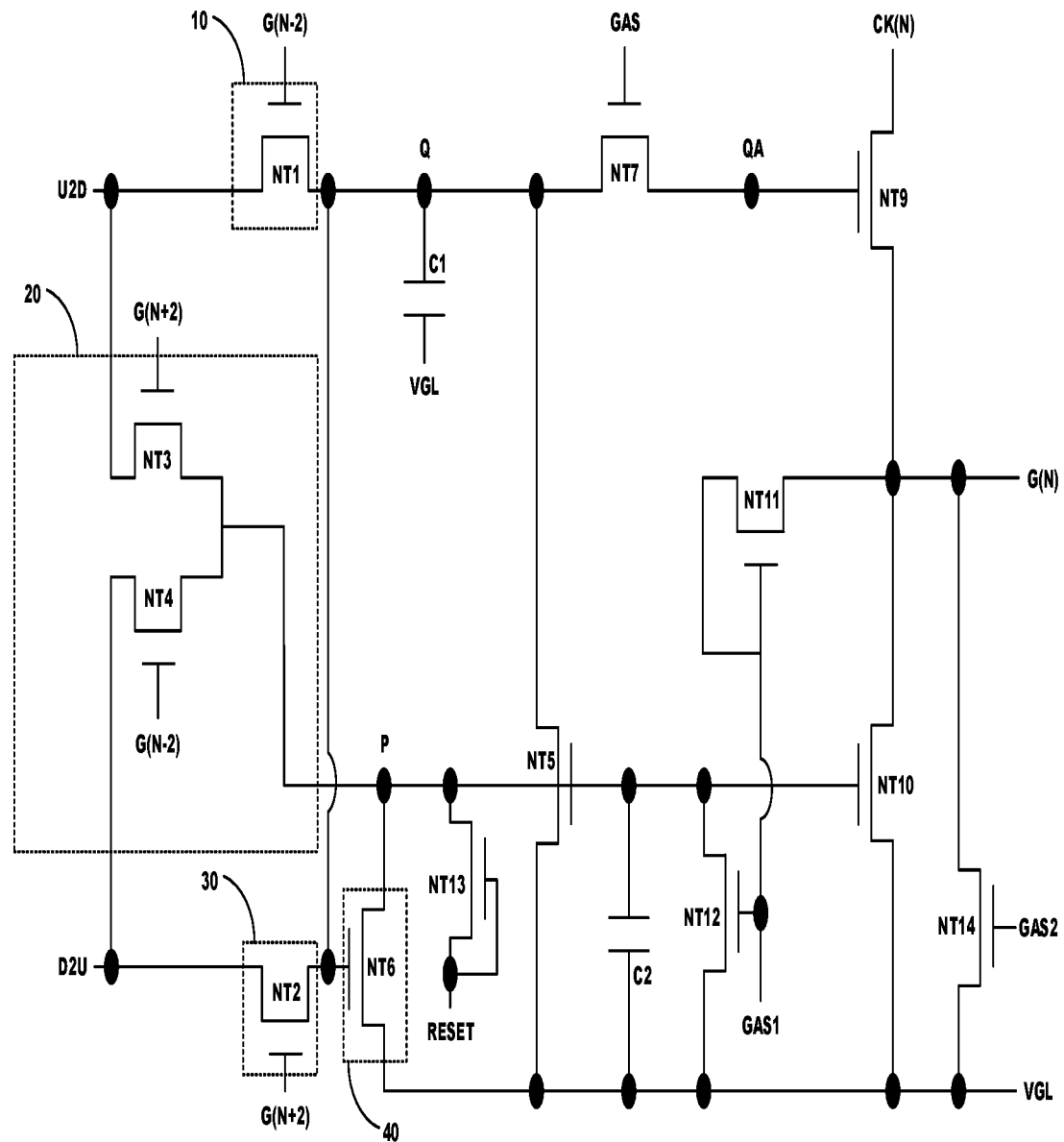
FIG. 2 is a schematic circuit diagram of a gate driving circuit provided by one embodiment of the present application.
Figure 3:
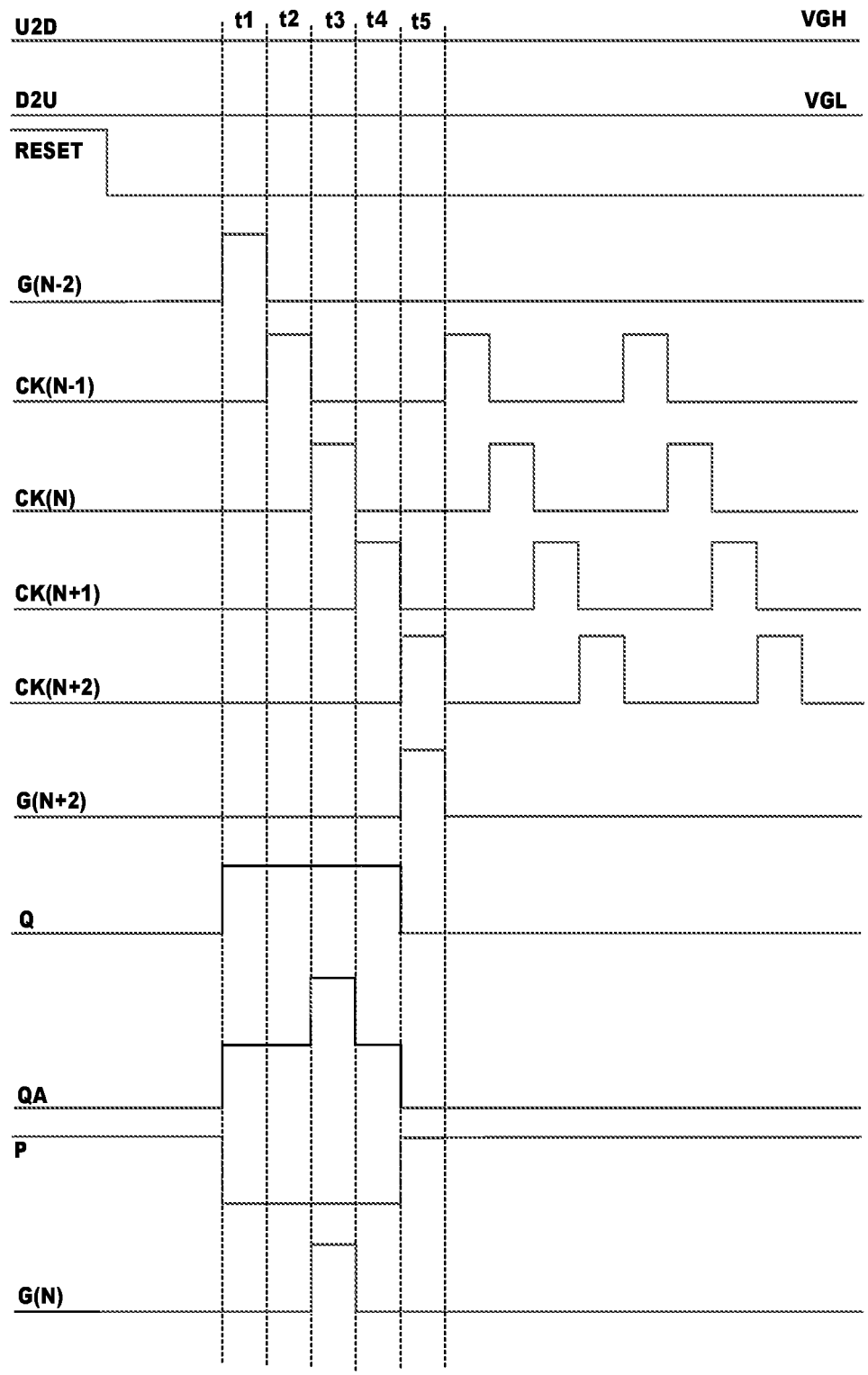
FIG. 3 is a time sequence diagram of the gate driving circuit shown in FIGS. 1 and 2.

Please refer to FIGS. 2 and 3, as shown in FIG. 2, this embodiment provides a gate driving circuit. The gate driving circuit includes a plurality of cascaded gate driving units, and wherein a Nth stage gate driving unit configured to output a Nth stage gate driving signal G(N) includes a pull-up control module 10 and a node signal control module 20. An output terminal of the pull-up control module 10 is electrically connected to a first pull-up node Q. A first input terminal of the node signal control module 20 is configured to receive a forward scan control signal U2D. A second input terminal of the node signal control module 20 is configured to receive a reverse scan control signal D2U. A first control terminal of the node signal control module 20 is configured to receive a first gate electrode driving signal. A second control terminal of the node signal control module 20 is configured to receive the second gate electrode driving signal. An output terminal of the node signal control module 20 is electrically connected to a pull-down node P.

It is understandable that in the gate driving circuit provided in this embodiment, by adjusting the signals received by the first input terminal, the second input terminal, the first control terminal, and the second control terminal of the node signal control module 20 to realize an original driving sequence without using clock signals, which reduces a number of clock signal lines, and reduces a space occupied by the frame. At the same time, because the currently driving time sequence can also be realized without using the clock signals, an overall load and an overall power consumption of the clock signals can be reduced.

It should be noted that a first gate driving signal can be, but is not limited to one of a N+1th stage gate driving signal, a N+2th stage gate driving signal G(N+2), a N+3th stage gate driving signal, and a N+4th stage gate driving signal, etc. Correspondingly, the second gate driving signal can be, but is not limited to one of a N−1th stage gate driving signal, a N−2th stage gate driving signal G(N−2), a N−3th stage gate driving signal, and a N−4th stage driving signal.

In one of the embodiments, the node signal control module 20 includes a first transistor NT3 and a second transistor NT4. One of a source electrode and a drain electrode of the first transistor NT3 is configured to receive the forward scan control signal U2D. A gate electrode of the first transistor NT3 is configured to receive the first gate electrode driving signal. One of a source electrode and a drain electrode of the second transistor NT4 is configured to receive the reverse scan control signal D2U. A gate electrode of the second transistor NT4 is configured to receive the second gate electrode driving signal. Another one of the source electrode and the drain electrode of the second transistor NT4 is electrically connected to the another one of the source electrode and the drain electrode of the first transistor NT3, and the pull-down node P.

Figure 1:
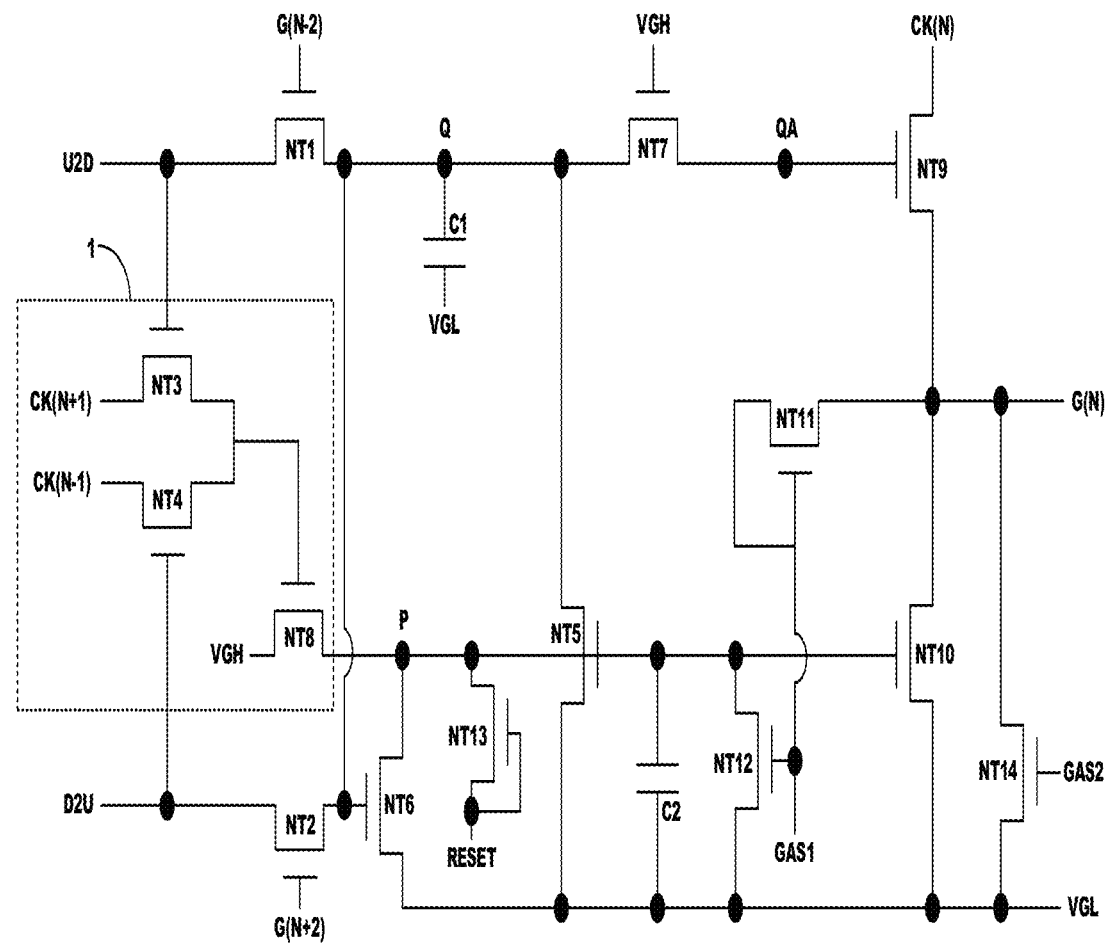
FIG. 1 is a schematic diagram of a gate driving circuit in a conventional technical solution.

It can be understood that, in this embodiment, there are only two thin film transistors in the node signal control module 20. Compared with the structure shown in FIG. 1, this embodiment can reduce one thin film transistor. Therefore, the gate driving circuit provided by this embodiment can further reduce a space occupied by the frame, which is beneficial to realize a narrower frame.

In one of the embodiments, a channel type of the first transistor NT3 is the same as a channel type of the second transistor NT4. For example, the first transistor NT3 and the second transistor NT4 may both be N-channel thin film transistors, specifically, It can be an oxide thin film transistor.

In one of the embodiments, an input terminal of the pull-up control module 10 is electrically connected to a first input terminal of the node signal control module 20. A control terminal of the pull-up control module 10 is electrically connected to a second control terminal of the pull-up control module 10.

It is understandable that in this embodiment, the input terminal of the pull-up control module 10 and the first input terminal of the node signal control module 20 can share the forward scan control signal U2D, and the gate driving circuit can save one input signal. Correspondingly, a line space of one input signal line can be reduced, and a space occupied by the frame of the gate driving circuit can be further reduced. In a same way, the control terminal of the pull-up control module 10 and the second control terminal of the pull-up control module 10 can share the second gate driving signal. The gate driving circuit can save one input signal, and correspondingly, a line space of one input signal line can be reduced, the space occupied by the frame of the gate driving circuit can be further reduced.

The pull-up control module 10 may include a transistor NT1, one of a source electrode and a drain electrode of the transistor NT1 is electrically connected to the one of the source electrode and the drain electrode of the first transistor NT3. A gate electrode of the transistor NT1 is electrically connected to the gate electrode the second transistor NT4. Another one of the source electrode and the drain electrode of the transistor NT1 is electrically connected to the first pull-up node Q.

It is understandable that the one of the source electrode and the drain electrode of the transistor NT1 and the one of the source electrode and the drain electrode of the first transistor NT3 can share the forward scan control signal U2D. The gate electrode of the transistor NT1 and gate electrode of the second transistor NT4 can share the second gate driving signal. The gate driving circuit can correspondingly save two input signals, and correspondingly, a line space of the two input signal lines can be reduced.

In one of the embodiments, the Nth stage gate driving unit further includes a reverse scanning auxiliary module 30. An input terminal of the reverse scanning auxiliary module 30 is electrically connected to a second input terminal of the node signal control module 20. A control terminal of the reverse scanning auxiliary module 30 is electrically connected to a first control terminal of the node signal control module 20. The output terminal of the reverse scan auxiliary module 30 is electrically connected to the first pull-up node Q.

It can be understood that, in this embodiment, the input terminal of the reverse scan auxiliary module 30 and the second input terminal of the node signal control module 20 can share the reverse scan control signal D2U, and the gate driving circuit can further save one input signal, correspondingly, can further reduce a line space of an input signal line, and further reduce the space occupied by the frame of the gate driving circuit. In the same way, the control terminal of the reverse scan auxiliary module 30 and the first control terminal of the node signal control module 20 can share the first gate driving signal. The gate driving circuit can further save one input signal, and correspondingly, it can further reduce a line space of an input signal line, and further reduce the space occupied by the frame of the gate driving circuit.

The reverse scan auxiliary module 30 may include a transistor NT2, one of a source electrode and a drain electrode of the transistor NT2 is electrically connected to one of the source electrode and the drain electrode of the second transistor NT4. A gate electrode of the transistor NT2 is electrically connected to the gate electrode of the first transistor NT3. Another one of the source electrode and the drain electrode of the transistor NT2 is electrically connected to the first pull-up node Q.

It should be noted that one of the source electrode and the drain electrode of the transistor NT2 and one of the source electrode and the drain electrode of the second transistor NT4 can share the reverse scan control signal D2U. The gate electrode of the transistor NT2 and the gate electrode of first transistor NT3 can share the first gate driving signal.

In one of the embodiments, the Nth stage gate driving unit further includes a first pull-down module 40. An input terminal of the first pull-down module 40 receives a low electrical potential signal VGL. A control terminal of the first pull-down module 40 is electrically connected to an output terminal of the reverse scanning auxiliary module 30. An output terminal of the first pull-down module 40 is electrically connected to the pull-down node P.

In one of the embodiments, the first pull-down module 40 may include a transistor NT6, one of a source electrode and a drain electrode of the transistor NT6 configured to receive a low electrical potential signal VGL. A gate electrode of the transistor NT6 is electrically connected to the another one of the source electrode and the drain electrode of the transistor NT2. Another one of the source electrode and the drain electrode of the transistor NT6 is electrically connected to the pull-down node P.

In one of the embodiments, the Nth stage gate driving unit further includes a third transistor NT7. One of a source electrode and a drain electrode of the third transistor NT7 is electrically connected to the first pull-up node Q. A gate electrode of the third transistor NT7 is configured to receive a first global control signal GAS. Another one of the source electrode and the drain electrode of the third transistor NT7 is electrically connected to a second pull-up node QA.

In one of the embodiments, the Nth stage gate driving unit further includes a first capacitor C1 and a fourth transistor NT9. One terminal of the first capacitor C1 is electrically connected to the first pull-up node Q. Another terminal of the first capacitor C1 is configured to receive the low electrical potential signal VGL. A gate electrode of the fourth transistor NT9 is electrically connected to the second pull-up node QA. One of a source electrode and a drain electrode of the fourth transistor NT9 is configured to receive a first clock signal CK (N). Another one of the source electrode ad the drain electrode of the fourth transistor NT9 is configured to output the Nth stage gate driving signal G(N).

In one of the embodiments, the Nth stage gate driving unit further includes a fifth transistor NT5, a sixth transistor NT10, a seventh transistor NT11, an eighth transistor NT12, a ninth transistor NT13, a tenth transistor NT14, and a second capacitor C2. One of a source electrode and a drain electrode of the fifth transistor NT5 is electrically connected to the another terminal of the first capacitor C1. A gate electrode of the fifth transistor NT5 is electrically connected to the pull-down node P. Another one of the source electrode and the drain electrode of the fifth transistor NT5 is electrically connected to the first pull-up node Q. One of a source electrode and a drain electrode of the sixth transistor NT10 is electrically connected to one of the source electrode and the drain electrode of the fifth transistor NT5. Another one of the source electrode and the drain electrode of the sixth transistor NT10 is electrically connected to the another one of the source electrode and the drain electrode of the fourth transistor NT9. A gate electrode of the sixth transistor NT10 is electrically connected to the pull-down node P. A gate of the seventh transistor NT11 is electrically connected to one of a source electrode and a drain electrode of the seventh transistor NT11 and receives a second global control signal GAS1. Another one of the source electrode and the drain electrode of the seventh transistor NT11 is electrically connected to the another one of the source electrode and the drain electrode of the sixth transistor NT10. A gate electrode of the eighth transistor NT12 is electrically connected to the gate electrode of the seventh transistor NT11. One of a source electrode and a drain electrode of the eighth transistor NT12 is electrically connected to the one of source electrode and the drain electrode of the sixth transistor NT10. Another one of the source electrode and the drain electrode of the eighth transistor NT12 is electrically connected to the pull-down node P. A gate electrode of the ninth transistor NT13 and one of the source electrode and the drain electrode of the ninth transistor NT13 receive a reset signal RESET. Another one of the source electrode and the drain electrode of the ninth transistor NT13 is electrically connected to the pull-down node P. A gate electrode of the tenth transistor NT14 receives a third global control signal GAS2. One of a source electrode and a drain electrode of the tenth transistor NT14 is electrically connected to the another one of the source electrode and the drain electrode of the eighth transistor NT12. Another one of the source electrode and the drain electrode of the tenth transistor NT14 is electrically connected to the another one of the source electrode and the drain electrode of the sixth transistor NT10. One terminal of the second capacitor C2 is electrically connected to the pull-down node P. Another terminal of the second capacitor C2 is electrically connected to the one of the source electrode and the drain electrode of the eighth transistor NT12.

It should be noted that the transistors NT1 to the tenth transistor NT14 in the above-mentioned embodiment can be, but are not limited to, N-channel thin film transistors. The transistors NT1 to the tenth transistor NT14 in the above-mentioned embodiment can also be P-channel thin film transistors, in this case, the electrical potential of each signal needs to be inverted.

The operating process of the above-mentioned gate driving circuit is shown in FIG. 3, and the details are as follows:

Before stage t1: Before a start of a frame, the reset signal RESET will be set high, the ninth transistor NT13 will be turned on, an electrical potential of the pull-down node P will be pre-pulled high, the fifth transistor NT5 and the sixth transistor NT10 will be turned on or conducted, and electrical potentials of the first pull-up node Q and the second pull-up node QA are pulled low, the fourth transistor NT9 is turned off, and an initial electrical potential of the gate driving signal G(N) of the Nth stage is low. After that, the reset signal RESET is set low, and the ninth transistor NT13 is turned off, waiting for an arrival of a stage t1.

Stage t1: The gate driving signal G(N−2) of the N−2th stage is at a high electrical potential, the transistor NT1 is turned on, the forward scanning control signal U2D at the same electrical potential as the high potential signal VGH is input, an electrical potential of the first pull-up node Q is pulled up to the high electrical potential, the first capacitor C1 is charged, the transistor NT6 is turned on, an electrical potential of the pull-down node P is pulled down, the fifth transistor NT5 and the sixth transistor NT10 are turned off, and an electrical potential of the second pull-up node QA changes to the high electrical potential.

Stage t2: The gate driving signal G(N−2) of the N−2th stage becomes a low electrical potential, the transistor NT1 is turned off, and the electrical potential of the first pull-up node Q is maintained at the high electrical potential through energy saved in the first capacitor C1, the electrical potential of the second pull-up node QA is maintained at the high electrical potential.

Stage t3: An electrical potential of the clock signal CK (N) turns high, and the electrical potential of the second pull-up node QA is affected by a bootstrap effect of the fourth transistor NT9, its electrical potential will rise and the fourth transistor NT9 is fully turned on. At this time, the clock signal CK (N) can be output in full swing as the Nth gate driving signal G(N).

Stage t4: The electrical potential of the clock signal CK (N) turns to the low electrical potential, the electrical potential of the second pull-up node QA remains at the high electrical potential, and the first transistor NT3 is still fully turned on. At this time, the electrical potential of the Nth gate driving signal G(N) is quickly pulled down to the low electrical potential.

Stage t5: The gate driving signal G(N+2) of the N+2 stage is at high electrical potential, the transistor NT2, the first transistor NT3 are turned on, the electrical potential of the first pull-up node Q is pulled down, and the electrical potential of the pull-down node P is pulled to the high electrical potential, the fifth transistor NT5 is turned on, the electrical potentials of the first pull-up node Q and the potential of the second pull-up node QA are pulled down, and the fourth transistor NT9 is turned off. The sixth transistor NT10 is turned on, and the gate driving signal G(N) of the Nth stage is maintained at the low electrical potential. During this process, the second capacitor C2 is charged up, keeping the fifth transistor NT5, and the sixth transistor NT10 in an on state, and maintaining a stability of the output.

It should be noted that the electrical potential of the aforementioned low potential signal VGL is the same as the electrical potential of the reverse scan control signal D2U, and both are low electrical potentials. The low electrical potential can turn off or close the N-channel thin film transistor. The electrical potential of the high electrical potential signal VGH is the same as that of the reverse scan control signal D2U, both are high electrical potentials, which can turn on or electrically conduct a N-channel thin film transistor.

In one of the embodiments, the present application provides a display panel including the gate driving circuit in at least one of the above embodiments, and the gate driving circuit is positioned in a non-display region of the display panel.

It is understandable that in the display panel provided in this embodiment, by adjusting the signals received by the first input terminal, the second input terminal, the first control terminal, and the second control terminal of the node signal control module 20 to realize an original driving sequence without using clock signals, which reduces a number of clock signal lines, and reduces a space occupied by the frame. At the same time, because the currently driving time sequence can also be realized without using the clock signals, an overall load and an overall power consumption of the clock signals can be reduced It can be understood that, for those of ordinary skill in the art, equivalent replacements or changes can be made according to the technical solutions of the present application and its inventive concept, and all these changes or replacements shall fall within a protection scope of the appended claims of the present application.

What is claimed is:

1. A gate driving circuit, wherein the gate driving circuit comprises a plurality of cascaded gate driving units, and wherein a Nth stage gate driving unit configured to output a Nth stage gate driving signal comprises:
    a pull-up control module, wherein an output terminal of the pull-up control module is electrically connected to a first pull-up node; and
    a node signal control module, wherein a first input terminal of the node signal control module is configured to receive a forward scan control signal, and wherein a second input terminal of the node signal control module is configured to receive a reverse scan control signal, and wherein a first control terminal of the node signal control module is configured to receive a first gate electrode driving signal, and wherein a second control terminal of the node signal control module is configured to receive a second gate electrode driving signal, and wherein an output terminal of the node signal control module is electrically connected to a pull-down node,
    wherein an input terminal of the pull-up control module is electrically connected to a first input terminal of the node signal control module, and a control terminal of the pull-up control module is electrically connected to the second gate electrode driving signal.

2. The gate driving circuit according to claim 1, wherein the node signal control module comprises:
    a first transistor, wherein one of a source electrode and a drain electrode of the first transistor is configured to receive the forward scan control signal, and wherein a gate electrode of the first transistor is configured to receive the first gate electrode driving signal; and
    a second transistor, wherein one of a source electrode and a drain electrode of the second transistor is configured to receive the reverse scan control signal, and wherein a gate electrode of the second transistor is configured to receive the second gate electrode driving signal, another one of the source electrode and the drain electrode of the second transistor is electrically connected to another one of the source electrode and the drain electrode of the first transistor, and the pull-down node.

3. The gate driving circuit according to claim 2, wherein a channel type of the first transistor is the same as a channel type of the second transistor.

4. The gate driving circuit according to claim 1, wherein the Nth stage gate driving unit further comprises:
    a reverse scanning auxiliary module, wherein an input terminal of the reverse scanning auxiliary module is electrically connected to a second input terminal of the node signal control module, and wherein a control terminal of the reverse scanning auxiliary module is electrically connected to a first control terminal of the node signal control module, and wherein the output terminal of the reverse scan auxiliary module is electrically connected to the first pull-up node.

5. The gate driving circuit according claim 4, wherein the Nth stage gate driving unit further comprises:
    a first pull-down module, wherein an input terminal of the first pull-down module receives a low electrical potential signal, and wherein a control terminal of the first pull-down module is electrically connected to an output terminal of the reverse scan auxiliary module, and wherein an output terminal of the first pull-down module is electrically connected to the pull-down node.

6. The gate driving circuit according to claim 1, wherein the Nth stage gate driving unit further comprises:
    a third transistor, wherein one of a source electrode and a drain electrode of the third transistor is electrically connected to the first pull-up node, wherein a gate electrode of the third transistor is configured to receive a first global control signal, and wherein another one of the source electrode and the drain electrode of the third transistor is electrically connected to a second pull-up node.

7. The gate driving circuit according to claim 6, wherein the Nth stage gate driving unit further comprises:
    a first capacitor, wherein one terminal of the first capacitor is electrically connected to the first pull-up node, and another terminal of the first capacitor receives a low electrical potential signal; and
    a fourth transistor, wherein a gate electrode of the fourth transistor is electrically connected
    to the second pull-up node, and wherein one of a source electrode and a drain electrode of the fourth transistor is configured to receive a first clock signal, and wherein another one of the source electrode and the drain electrode of the fourth transistor is configured to output the Nth stage gate driving signal.

8. The gate driving circuit according to claim 7, wherein the Nth stage gate driving unit further comprises:
    a fifth transistor, wherein one of a source electrode and a drain electrode of the fifth transistor is electrically connected to the another terminal of the first capacitor, and wherein a gate electrode of the fifth transistor is electrically connected to the pull-down node, and wherein another one of the source electrode and the drain electrode of the fifth transistor is electrically connected to the first pull-up node;
    a sixth transistor, wherein one of a source electrode and a drain electrode of the sixth transistor is electrically connected to the one of the source electrode and the drain electrode of the fifth transistor, and wherein another one of the source electrode and the drain electrode of the sixth transistor is electrically connected to another one of the source electrode and the drain electrode of the fourth transistor, and wherein a gate electrode of the sixth transistor is electrically connected to the pull-down node;

a seventh transistor, wherein a gate electrode of the seventh transistor is electrically connected to one of a source electrode and a drain electrode of the seventh transistor and receives a second global control signal, wherein another one of a source electrode and a drain electrode of the seventh transistor is electrically connected to the another one of the source electrode and the drain electrode of the sixth transistor;

an eighth transistor, wherein a gate electrode of the eighth transistor is electrically connected to the gate electrode of the seventh transistor, and one of a source electrode and a drain electrode of the eighth transistor is electrically connected to the one of the source electrode and the drain electrode of the sixth transistor, and wherein another one of the source electrode and the drain electrode is electrically connected to the pull-down node;

a ninth transistor, wherein a gate electrode of the ninth transistor and one of a source electrode and a drain electrode of the ninth transistor receive a reset signal, and wherein another one of the source electrode and the drain electrode of the ninth transistor is electrically connected to the pull-down node;

a tenth transistor, wherein a gate electrode of the tenth transistor receives a third global control signal, wherein one of a source electrode and a drain electrode of the tenth transistor is electrically connected to another one of the source electrode and the drain electrode of the eighth transistor, and wherein another one of the source electrode and the drain electrode of the tenth transistor is electrically connected to the another one of the source electrode and the drain electrode of the sixth transistor; and a second capacitor, wherein one terminal of the second capacitor is electrically connected to the pull-down node, and another terminal of the second capacitor is electrically connected to the one of the source electrode and the drain electrode of the eighth transistor.

9. A display panel, comprising a gate driving circuit, the gate driving circuit comprising a plurality of cascaded gate driving units, wherein a Nth stage gate driving unit configured to output a Nth stage gate driving signal comprises:

a pull-up control module, wherein an output terminal of the pull-up control module is electrically connected to a first pull-up node; and a node signal control module, wherein a first input terminal of the node signal control module is configured to receive a forward scan control signal, and wherein a second input terminal of the node signal control module is configured to receive a reverse scan control signal, and wherein a first control terminal of the node signal control module is configured to receive a first gate electrode driving signal, and wherein a second control terminal of the node signal control module is configured to receive a second gate electrode driving signal, and wherein an output terminal of the node signal control module is electrically connected to a pull-down node, wherein the gate driving circuit is positioned in a non-display region of the display panel, wherein an input terminal of the pull-up control module is electrically connected to a first input terminal of the node signal control module, and a control terminal of the pull-up control module is electrically connected to the second gate electrode driving signal.

10. The display panel according to claim 9, wherein the node signal control module comprises:

a first transistor, wherein one of a source electrode and a drain electrode of the first transistor is configured to receive the forward scan control signal, and wherein a gate electrode of the first transistor is configured to receive the first gate electrode driving signal; and a second transistor, wherein one of a source electrode and a drain electrode of the second transistor is configured to receive the reverse scan control signal, and wherein a gate electrode of the second transistor is configured to receive the second gate electrode driving signal, another one of the source electrode and the drain electrode of the second transistor is electrically connected to another one of the source electrode and the drain electrode of the first transistor, and the pull-down node.

11. The display panel according to claim 10, wherein a channel type of the first transistor is the same as a channel type of the second transistor.

12. The display panel of claim 9, wherein the Nth stage gate driving unit further comprises:

a reverse scanning auxiliary module, wherein an input terminal of the reverse scanning auxiliary module is electrically connected to a second input terminal of the node signal control module, and wherein a control terminal of the reverse scanning auxiliary module is electrically connected to a first control terminal of the node signal control module, and wherein the output terminal of the reverse scan auxiliary module is electrically connected to the first pull-up node.

13. The display panel according to claim 12, wherein the Nth stage gate driving unit further comprises:

a first pull-down module, wherein an input terminal of the first pull-down module receives a low electrical potential signal, and wherein a control terminal of the first pull-down module is electrically connected to an output terminal of the reverse scan auxiliary module, and wherein an output terminal of the first pull-down module is electrically connected to the pull-down node.

14. The display panel according to claim 9, wherein the Nth stage gate driving unit further comprises:

a third transistor, wherein one of a source electrode and a drain electrode of the third transistor is electrically connected to the first pull-up node, wherein a gate electrode of the third transistor is configured to receive a first global control signal, and wherein another one of the source electrode and the drain electrode of the third transistor is electrically connected to a second pull-up node.

15. The display panel according to claim 14, wherein the Nth stage gate driving unit further comprises:

a first capacitor, wherein one terminal of the first capacitor is electrically connected to the first pull-up node, and another terminal of the first capacitor receives a low electrical potential signal; and a fourth transistor, wherein a gate electrode of the fourth transistor is electrically connected to the second pull-up node, and wherein one of a source electrode and a drain electrode of the fourth transistor is configured to receive a first clock signal, and wherein another one of the source electrode and the drain electrode of the fourth transistor is configured to output the Nth stage gate driving signal.

16. The display panel according to claim 15, wherein the Nth stage gate driving unit further comprises:
   a fifth transistor, wherein one of a source electrode and a drain electrode of the fifth transistor is electrically connected to the another terminal of the first capacitor, and wherein a gate electrode of the fifth transistor is electrically connected to the pull-down node, and wherein another one of the source electrode and the drain electrode of the fifth transistor is electrically connected to the first pull-up node;
   a sixth transistor, wherein one of a source electrode and a drain electrode of the sixth transistor is electrically connected to the one of the source electrode and the drain electrode of the fifth transistor, and wherein another one of the source electrode and the drain electrode of the sixth transistor is electrically connected to another one of the source electrode and the drain electrode of the fourth transistor, and wherein a gate electrode of the sixth transistor is electrically connected to the pull-down node.

17. The display panel according to claim 16, wherein the Nth stage gate driving unit further comprises:
   a seventh transistor, wherein a gate electrode of the seventh transistor is electrically connected to one of a source electrode and a drain electrode of the seventh transistor and receives a second global control signal, wherein another one of a source electrode and a drain electrode of the seventh transistor is electrically connected to the another one of the source electrode and the drain electrode of the sixth transistor;
   an eighth transistor, wherein a gate electrode of the eighth transistor is electrically connected to the gate electrode of the seventh transistor, and one of a source electrode and a drain electrode of the eighth transistor is electrically connected to the one of the source electrode and the drain electrode of the sixth transistor, and wherein another one of the source electrode and the drain electrode is electrically connected to the pull-down node.

18. The display panel of claim 17, wherein the Nth stage gate driving unit further comprises:
   a ninth transistor, wherein a gate electrode of the ninth transistor and one of a source electrode and a drain electrode of the ninth transistor receive a reset signal, and wherein another one of the source electrode and the drain electrode of the ninth transistor is electrically connected to the pull-down node;
   a tenth transistor, wherein a gate electrode of the tenth transistor receives a third global control signal, wherein one of a source electrode and a drain electrode of the tenth transistor is electrically connected to another one of the source electrode and the drain electrode of the eighth transistor, and wherein another one of the source electrode and the drain electrode of the tenth transistor is electrically connected to the another one of the source electrode and the drain electrode of the sixth transistor; and
   a second capacitor, wherein one terminal of the second capacitor is electrically connected to the pull-down node, and another terminal of the second capacitor is electrically connected to the one of the source electrode and the drain electrode of the eighth transistor.

* * * * *